(12) United States Patent
Takahashi et al.

(10) Patent No.: US 8,169,075 B2
(45) Date of Patent: May 1, 2012

(54) ELECTRONIC PART WITH AFFIXED MEMS

(75) Inventors: Tetsuya Takahashi, Kawasaki (JP);
Kenji Kobae, Kawasaki (JP); Shuichi Takeuchi, Kawasaki (JP); Yoshiyuki Satoh, Kawasaki (JP); Hidehiko Kira, Kawasaki (JP); Takayoshi Matsumura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 32 days.

(21) Appl. No.: 12/402,881

(22) Filed: Mar. 12, 2009

(65) Prior Publication Data

US 2009/0243006 A1 Oct. 1, 2009

(30) Foreign Application Priority Data

Mar. 19, 2008 (JP) .................................. 2008-71134
Dec. 18, 2008 (JP) ................................ 2008-321833

(51) Int. Cl.
*H01L 29/40* (2006.01)
(52) U.S. Cl. .. 257/737; 257/734; 257/711; 257/E23.001
(58) Field of Classification Search .................. 257/737, 257/734, 711, 678, E23.001
See application file for complete search history.

(56) References Cited

U.S. PATENT DOCUMENTS

| 6,882,455 | B2 | 4/2005 | Arima | |
|---|---|---|---|---|
| 7,214,622 | B2 | 5/2007 | Sugiyama et al. | |
| 2004/0188786 | A1* | 9/2004 | Bar-Sadeh et al. | 257/419 |
| 2008/0308920 | A1* | 12/2008 | Wan | 257/685 |

FOREIGN PATENT DOCUMENTS

| JP | 09-293758 A | 11/1997 |
|---|---|---|
| JP | 2003-262803 A | 9/2003 |
| JP | 2004-330363 A | 11/2004 |
| JP | 2006-49477 A | 2/2006 |
| JP | 2006-108261 A | 4/2006 |
| JP | 2006-251829 A | 9/2006 |
| JP | 2008-091724 A | 4/2008 |

* cited by examiner

*Primary Examiner* — Matthew Reames
*Assistant Examiner* — Elias M Ullah
(74) *Attorney, Agent, or Firm* — Arent Fox LLP

(57) ABSTRACT

According to an aspect of the invention, an electronic part includes a substrate having a first planar surface, a first bump affixed to the first planar surface of the substrate, a second bump affixed to the first planar surface of the substrate a predetermined distance from the first bump, a MEMS chip including a element, the MEMS chip coupled to the first bump and the second bump, the MEMS chip distanced from the first planar surface, an adhesive region bonding with the first bump, the substrate and the MEMS chip.

3 Claims, 13 Drawing Sheets

ELECTRONIC PART WITH AFFIXED MEMS

CROSS-REFERENCE TO RELATED APPLICATIONS

This application is based upon and claims the benefit of priority of the prior Japanese Patent Application No. 2008-71134, filed on Mar. 19, 2008, No. 2008-321833, filed on Dec. 18, 2008 the entire contents of which are incorporated herein by reference.

FIELD

An aspect of the invention relates to an electronic part.

DESCRIPTION OF THE RELATED ART

In optical communication, an optical MEMS (Micro Electro Mechanical System) using a micro mirror element is used to switch an optical signal between an optical fiber used in transmission of an optical signal and another optical fiber.

FIG. 13 is a plan view showing a configuration of an electronic part (MEMS) 20 including a micro mirror element 10. The electronic part 20 is formed on a substrate 11 including of silicon such that a MEMS chip 12 including silicon is joined to a surface of the substrate 11 substantially parallel to each other. A plurality of micro mirror elements 10 are arranged along a line on a center part of the MEMS chip 12. The micro mirror element 10 is tiltably supported, and inclination of the micro mirror element 10 is controlled by using the function of static electricity.

FIG. 14 is a sectional view of the electronic part 20 along an A-A line. Bumps 13 and 14 arranged on the surface of the substrate 11 support the MEMS chip 12 to cause the MEMS chip 12 to be separated from the substrate 11. In order to secure a clearance between the substrate 11 and the MEMS chip 12, the bumps 13 and 14 are each formed of two bumps stacked by ball bonding. The MEMS chip 12 is separated from the substrate 11 in order to reduce restrictions of tilting of the micro mirror element 10.

The bump 13 is a conducting bump which electrically connects the substrate 11 and the MEMS chip 12. The bump is formed to be electrically connected to a wiring pattern formed on the substrate 11 and electrically connected by the MEMS chip 12 and a conductive paste 15. The micro mirror element 10 is tilted by imparting a potential to electrodes formed around the micro mirror element 10. The wiring pattern of the substrate 11 and, electrodes and wires formed on the MEMS chip 12 are electrically connected to each other through the conducting bump 13.

The bump 14 is a reinforcing bump to support the MEMS chip 12 substantially parallel to the substrate 11. As shown in FIG. 13, the bump 14 is arranged at a position near an edge of the MEMS chip 12 separated from the micro mirror element 10. An adhesive agent 16 is supplied to a portion where the bump 14 is arranged, and the adhesive agent 16 bonds the substrate 11 and the MEMS chip 12 to each other.

PATENT DOCUMENT 1

Japanese Laid-open Patent Publication No. 2006-251829

PATENT DOCUMENT 2

Japanese Laid-open Patent Publication No. 2003-262803

PATENT DOCUMENT 3

Japanese Laid-open Patent Publication No. 2004-330363

PATENT DOCUMENT 4

Japanese Laid-open Patent Publication No. 2006-108261

In the electronic part (MEMS) 20 described above, the reinforcing bump 14 secures a clearance between the substrate 11 and the MEMS chip 12, and supports the MEMS chip 12 substantially parallel to the substrate 11. However, when the MEMS chip 12 is joined to the substrate 11 using the adhesive agent 16, the adhesive agent 16 contracts when the adhesive agent 16 is thermally hardened. Contractive force of the adhesive agent 16 may cause deformation such as undulation in the MEMS chip 12. FIG. 15 shows the deformation of the MEMS chip 12.

When the deformation occurs in the MEMS chip 12, the deformation also influences a region in which the micro mirror element 10 is arranged. As a result, a problem is posed in an inclination or an operation of the micro mirror element 10.

SUMMARY

According to an aspect, an electronic part includes a substrate having a first planar surface, a first bump affixed to the first planar surface of the substrate, a second bump affixed to the first planar surface of the substrate a predetermined distance from the first bump, a MEMS chip including an element, the MEMS chip affixed to the first bump and the second bump, the MEMS chip distanced from the first planar surface, an adhesive region bonding with the first bump, the substrate and the MEMS chip.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DETAILED DESCRIPTION OF THE PREFERRED EMBODIMENTS

Embodiments are described below in detail with reference to the accompanying drawings.

Figure 1:
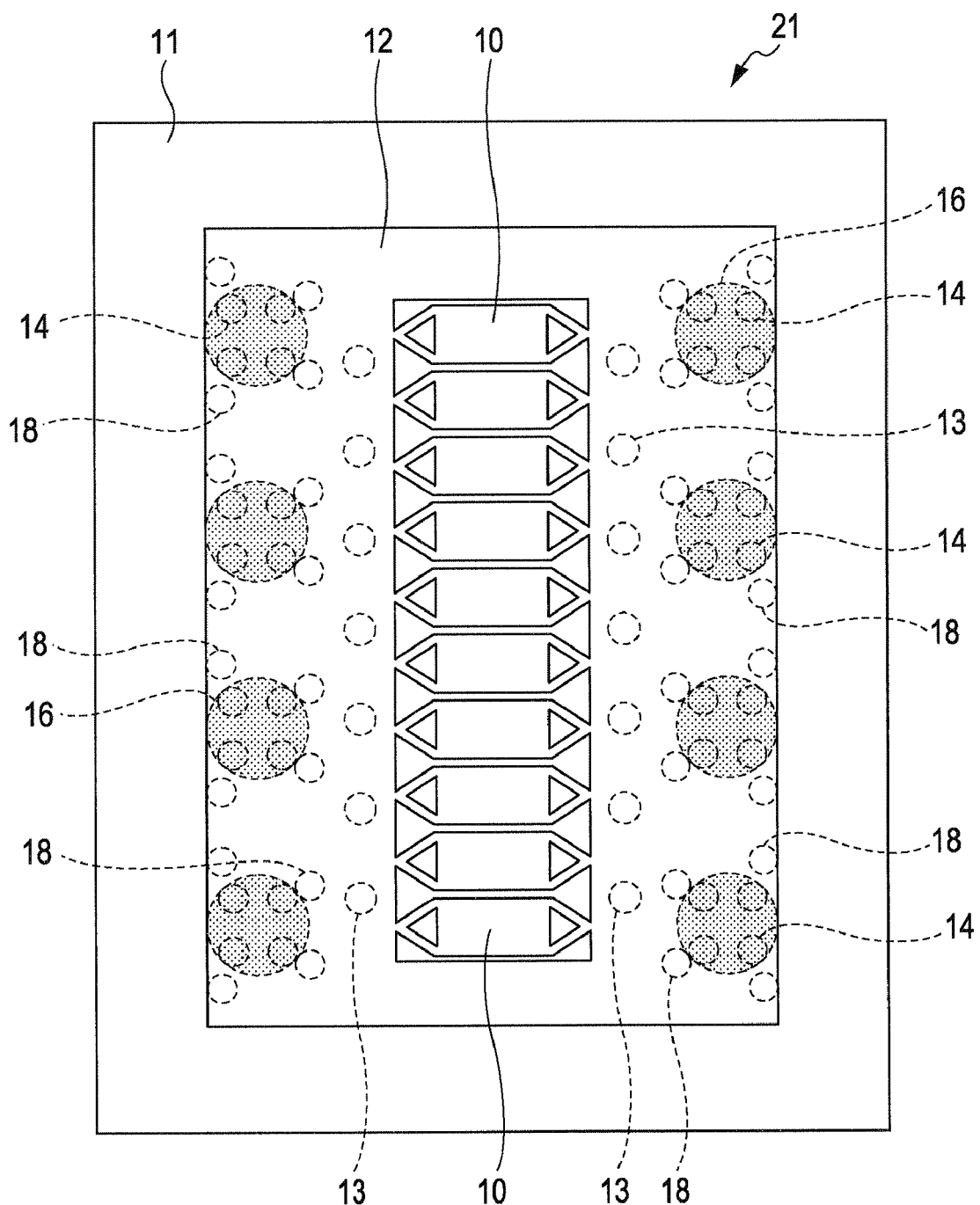
FIG. 1 is a plan view of a first embodiment of an element mounting structure.

FIG. 1 shows an electronic component according to the embodiment. An electronic part 21 includes a substrate 11 on which a wiring pattern is formed and a MEMS chip 12 is mounted on the substrate 11. The MEMS chip 12 has a plurality of micro mirror elements 10 which are arranged substantially parallel as movable parts. The MEMS chip 12 contains silicon as a base material. The micro mirror element 10 is tiltably supported on the MEMS chip 12 by a support frame or the like.

Figure 13:
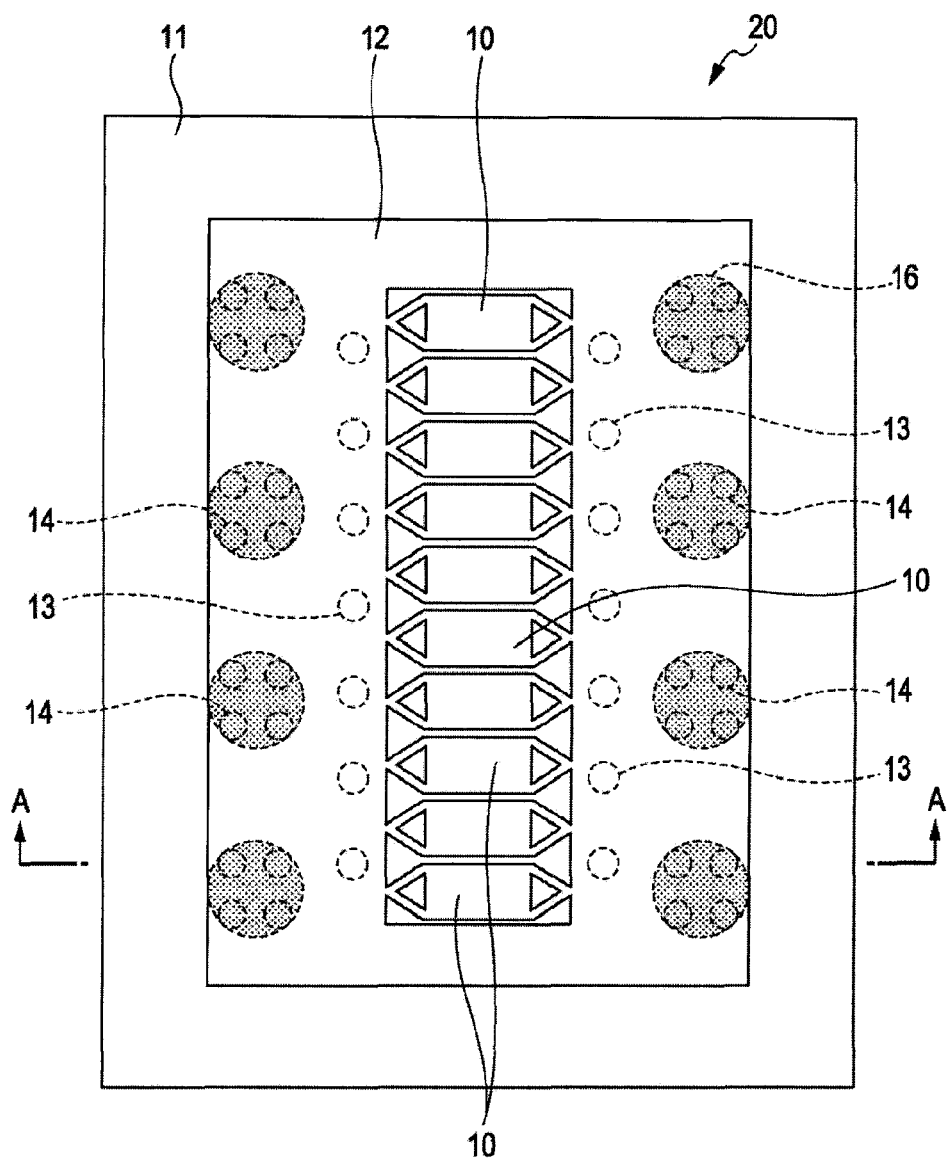
FIG. 13 is a plan view showing a conventional structure of an element manufacturing structure.
Figure 14:
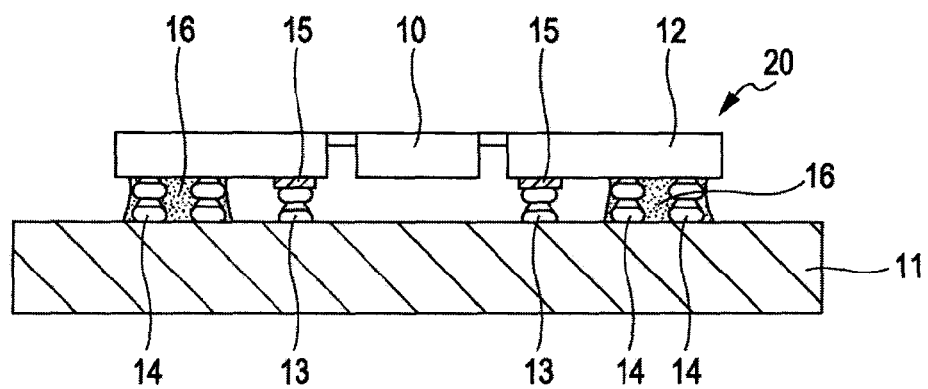
FIG. 14 is a sectional view along an A-A line in FIG. 13.
Figure 15:
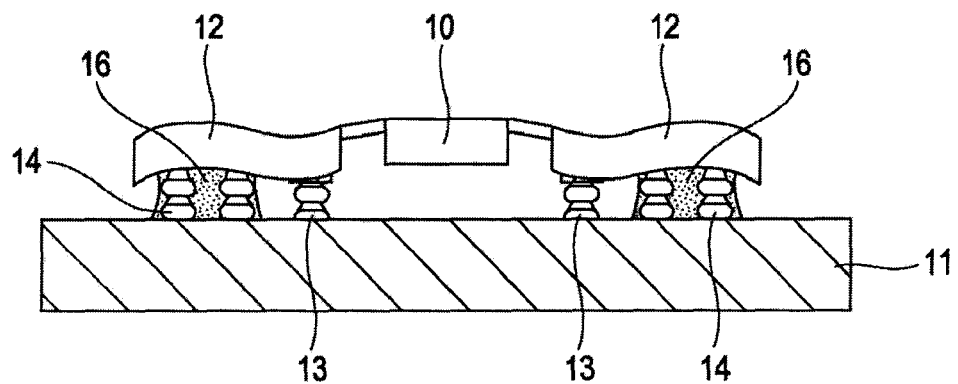
FIG. 15 is a sectional view of an MEMS showing a state in which an MEMS chip is deformed.

A method of mounting the MEMS chip 12 on the substrate 11 may be a mounting method shown in FIG. 13. In the mounting method, a conductive paste is applied to the conducting bump 13 formed on the substrate 11, an adhesive agent 16 is supplied to the reinforcing bump 14, the MEMS chip 12 is aligned and arranged on the substrate 11, and the MEMS chip 12 is pressurized and heated to be joined to the substrate 11. The bump 13 is joined to the MEMS chip 12 through the conductive paste, and the substrate 11 and the MEMS chip 12 are bonded to each other through the adhesive agent 16 at a position where the bump 14 is arranged.

In this MEMS mounting structure, a second bump 18 is arranged in an area outside the reinforcing bump (first bump) 14 used to join the MEMS chip 12 and the substrate 11 by supplying the adhesive agent 16.

FIG. 1 shows four bumps arranged at vertex positions of a substantially square shape in each adhesive region and the adhesive agent 16 applied to a region surrounding the bumps 14.

The second bumps 18 are arranged outside the first bumps 14 and at a position slightly spaced apart from the bumps 14. A method of forming the second bump 18 and the bump 13 may be the same as the method of forming the bump 14.

Each of the bumps 14 and the bumps 18 is formed by stacking two bumps. The bumps 14 and 18 may be formed by a ball bonding method using a gold wire. A first-layer bump having a small projection is formed as follows. That is, a ball portion obtained by melting a gold wire is brought into press contact with a surface of the substrate 11, and a proximal end of the gold wire is cut while the gold wire is straightly drawn up.

A height for each of the first bump 14 and the second bump 18, each constituted by a two-layer bump, is about 10 μm. When the number of layers of the bumps is increased, a clearance between the substrate 11 and the MEMS chip 12 increases.

The first bump 14, the second bump 18, and the conducting bump 13 formed by ball bonding using the same gold wire can be formed in the same shape. The first bump 14, the second bump 18, and the conducting bump 13 can be freely arranged on a surface of the substrate 11.

A distance between the first bump 14 and the second bump 18 suppresses the adhesive agent 16 from adhering to the second bump 18.

Figure 2A:
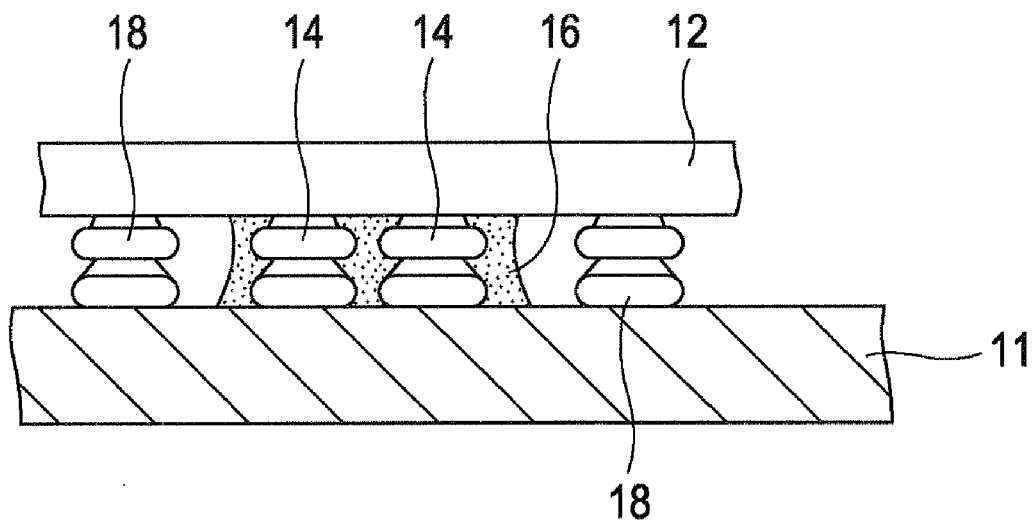
FIG. 2A is a sectional view of an embodiment of a portion near a bonding region of the element mounting structure.

FIG. 2A is an enlarged view in which the MEMS chip 12 is joined to the substrate 11 by the first bump 14 and the second bump 18. The adhesive agent 16 wraps the first bump 14, and is filled between the substrate 11 and the MEMS chip 12. The adhesive agent 16 is not in contact with the second bump 18 by adjustment of a supply position and a supply amount of the adhesive agent 16.

A structure having the first bump 14 to which the adhesive agent 16 adheres and the second bump 18 to which the adhesive agent 16 does not adhere suppresses the MEMS chip 12 from being deformed (warped).

Figure 2B:
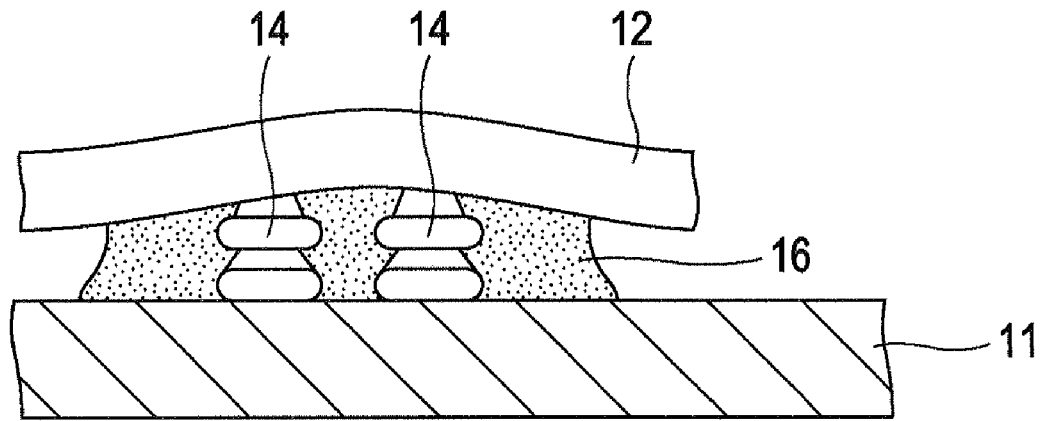
FIG. 2B is a sectional view of a conventional art.

FIG. 2B shows a junction between the substrate 11 and the MEMS chip 12 by using a conventional first bump 14. Hardening of the adhesive agent 16 which covers the first bump 14 and is filled between the substrate 11 and the MEMS chip 12 deforms the MEMS chip by contraction force.

In contrast to this, in the embodiment, regardless of the contraction force by the adhesive agent 16, the MEMS chip 12 is suppressed from being deformed (warped). This is because the second bump 18 supports the MEMS chip 12 against the contraction force.

In order to suppress the MEMS chip 12 from being deformed by the support of the MEMS chip 12 by the second bump 18, the second bump 18 is preferably arranged outside the first bump 14 and at a position which surrounds the first bump 14. FIG. 1 shows four second bumps 18 arranged around a position where the four first bumps 14 are arranged. The arrangement of the second bumps 18 is not limited to an illustrated arrangement.

The first bump 14 and the second bump 18 are formed by ball bonding using metal wires. A designer can arbitrarily set the arrangement positions of the first bump 14 and the second bump 18.

The part according to the embodiment can be manufactured by an apparatus used for joining the conventional substrate 11 and the MEMS chip 12.

The first bump 14 and the second bump 18 determine the height of the MEMS chip 12 with respect to the substrate 11. Bumps are formed by ball bonding and tops of the bumps are brought into press contact with a flat surface of a glass plate or the like. The first bump 14, the second bump 18, and the conducting bump 13 are leveled, and a conductive paste serving as a conductive material is applied to the conducting bump 13. The adhesive agent 16 is supplied to the first bump 14, and the MEMS chip 12 is brought into press contact with the substrate 11 and heated to be joined to the substrate 11, so that the first bump 14 and the second bump 18 are generated.

The embodiment has an effect of increasing a yield of the electronic part 21 and suppressing the variation of qualities of the electronic part 21.

Figure 3:
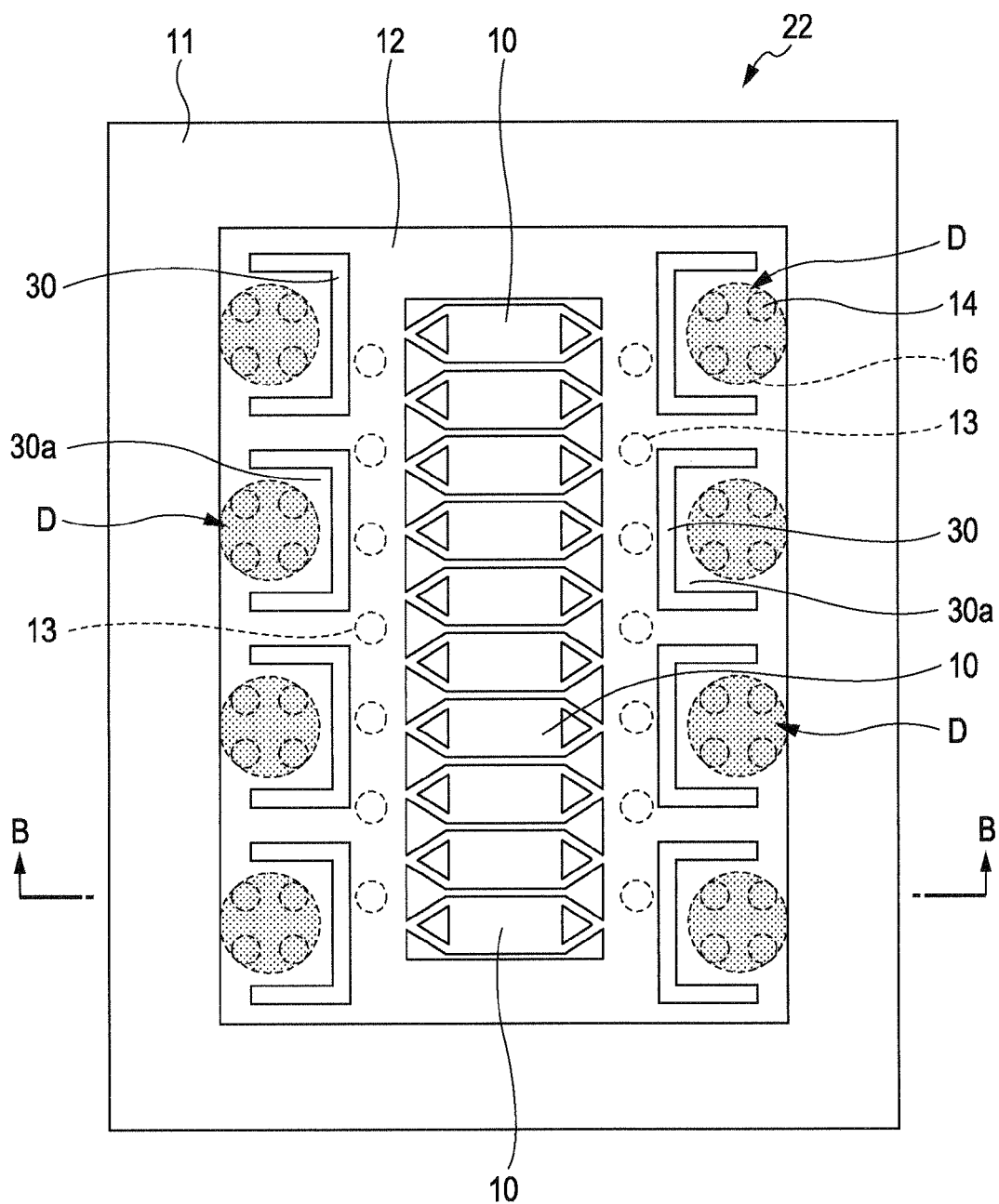
FIG. 3 is a plan view of a second embodiment of an element mounting structure.

FIG. 3 shows a configuration of a second embodiment of an element mounting structure. An electronic part 22 includes the substrate 11, the conducting bump 13 and the reinforcing bump 14 arranged on the substrate 11, and the MEMS chip 12 supported by the bump 13 and the bump 14.

In the depicted embodiment, a slit is formed near an adhesive region which is in contact with the bumps 14 and in which the adhesive agent 16 is hardened. This slit has an effect of preventing stress caused by contraction of the adhesive agent 16 from acting on the micro mirror element 10. A slit 30 is formed to penetrate the MEMS chip 12 in a thickness direction.

In an example shown in FIG. 3, four adhesive regions D are arranged on each of both edges of the MEMS chip 12 in a longitudinal direction, i.e., a total of eight adhesive regions D are formed. The four bumps 14 are arranged in each of the adhesive regions D, and the adhesive agent 16 is supplied to wrap the bumps 14.

The slit 30 is formed in a U shape in a planar view, and openings formed by the slit 30 face each other across a region in which the micro mirror element 10 is arranged.

Since the adhesive region D and the region in which the micro mirror element 10 is formed are not directly connected to each other, the slit 30 suppresses stress generated by contraction of the adhesive agent 16 from being transmitted to the periphery of the micro mirror element 10.

The slit 30 arranged around a half or more circumference of the adhesive region D has a region 30a surrounded by the slit 30 as a range of motion. In this manner, stress caused in the adhesive region D can be further prevented from being transmitted to the region in which the micro mirror element 10 is formed.

Figure 4:
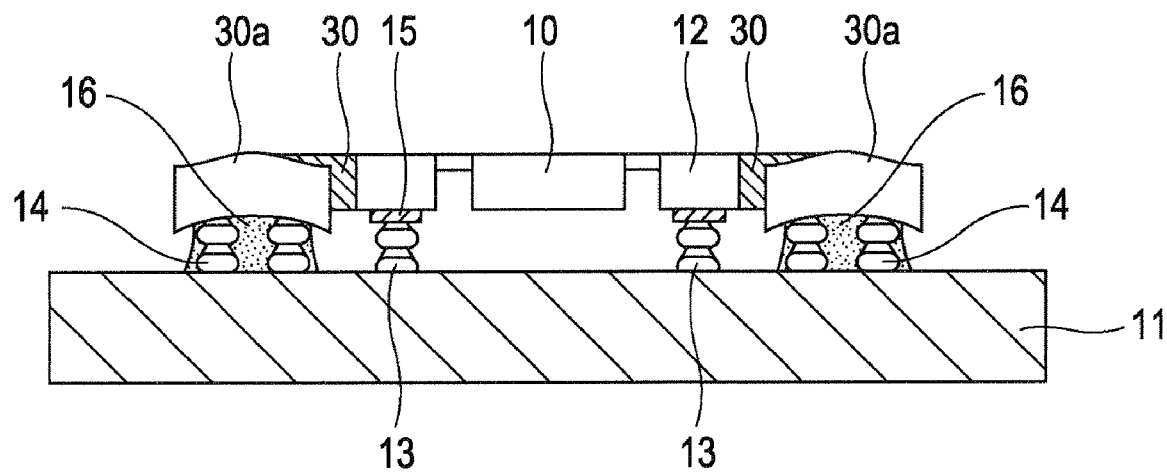
FIG. 4 is a sectional view along a B-B line in FIG. 3.

FIG. 4 shows a section along a B-B line in FIG. 3. FIG. 4 shows a section of a junction state between the MEMS chip 12 having the slit 30 and the substrate 11. The MEMS chip 12 is aligned to the substrate 11, the MEMS chip 12 is brought into press contact with the substrate 11 and heated, and the adhesive agent 16 is thermally hardened to join the MEMS chip 12 and the substrate 11 to each other. When the adhesive agent 16 contracts in hardening, a base material of the MEMS chip 12 is pulled to the substrate 11 side and curved in the region 30a surrounded by the slit 30. Stress caused by contraction force of the adhesive agent 16 acting on the MEMS chip 12 is absorbed as deformation of the MEMS chip 12 in the region 30a, and stress acting on the MEMS chip 12 is prevented from affecting the micro mirror element 10.

The slit 30 does not spoil the function of the bumps which support the MEMS chip 12 such that the MEMS chip is spaced apart from the substrate 11.

In the embodiment, since the conducting bumps 13 are arranged along the region in which the micro mirror elements 10 are formed, the height of the micro mirror element 10 from the substrate 11 is secured by the conducting bump 13, and the micro mirror element 10 can be flatly supported.

In the embodiment shown in FIG. 3, the U-shaped slit 30 surrounds the adhesive region D. However, the arrangement position or the shape of the slit 30 can be arbitrarily selected. For example, the shape of the slit 30 may be curved or linear. In addition, in place of the slits 30 independently arranged in the respective adhesive regions D, slits may be arranged to communicate with each other throughout the plurality of adhesive regions D.

Figure 5:
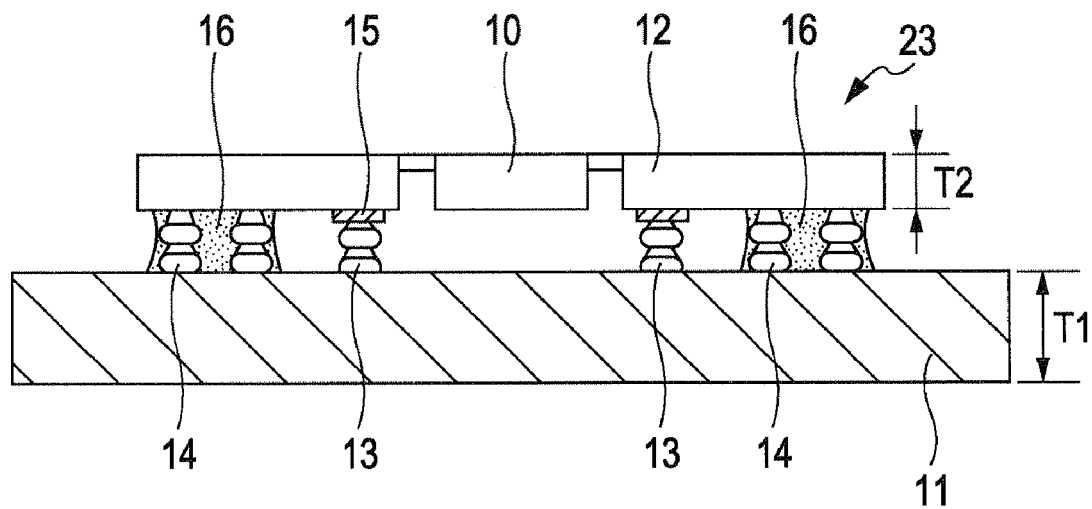
FIG. 5 is a sectional view of a third embodiment of an element mounting structure.

FIG. 5 is a sectional view showing a configuration of a third embodiment of an element mounting structure. An electronic part (MEMS) 23 of the embodiment absorbs stress caused by the adhesive agent 16 on the substrate 11 side to absorb or moderate deformation occurring in the MEMS chip 12.

In the electronic part 23 shown in FIG. 5, the MEMS chip 12 is supported by the conducting bump 13 and the reinforcing bump 14 arranged on the substrate 11 such that the MEMS chip 12 is spaced apart from the substrate 11. The bump 13 and the MEMS chip 12 are connected to each other by a conductive paste 15, and the adhesive agent 16 is supplied to a portion where the bump 14 is arranged to join the substrate 11 and the MEMS chip 12 to each other.

In the embodiment, stress generated when the adhesive agent 16 in hardened is absorbed by the substrate 11 having a thickness T1 smaller than a thickness T2 of the MEMS chip 12. The substrate 11 and the MEMS chip 12 include the same silicon. The stress is absorbed by deforming the substrate 11. For this reason, the MEMS chip 12 is suppressed from being deformed.

In the first embodiment and the second embodiment, the thickness of the MEMS chip 12 is about 150 μm, and the thickness of the substrate 11 is about 600 μm.

In the third embodiment, the thickness of the MEMS chip 12 is 150 μm, and the thickness of the substrate 11 is about 150 μm or less, for example, about 100 μm to about 70 μm.

In the third embodiment, when the substrate 11 is deformed, the MEMS chip 12 is suppressed from being deformed, and the characteristics of the micro mirror element 10 can be suppressed from being changed.

FIG. 6 shows a section of a fourth embodiment, and a method of manufacturing the electronic part 24 including the micro mirror element 10.

After the conducting bump 13 and the reinforcing bump 14 are formed on the substrate 11, an adhesive agent 40 is applied to vertexes of the bumps 13 and 14, and the substrate 11 and the MEMS chip 12 are bonded to each other through the adhesive agent 40 adhering to the distal ends of the bumps 13 and 14, so that the electronic part 24 according to the embodiment is formed.

Figure 6A:
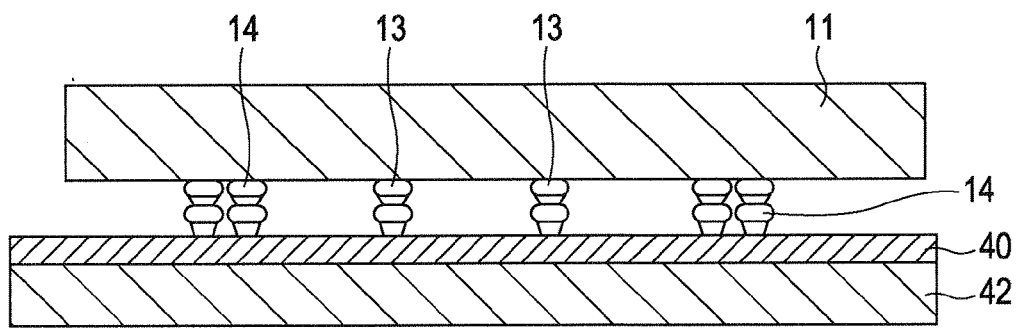
FIGS. 6A to 6C are sectional views of a fourth embodiment of an element mounting structure.
Figure 6B:
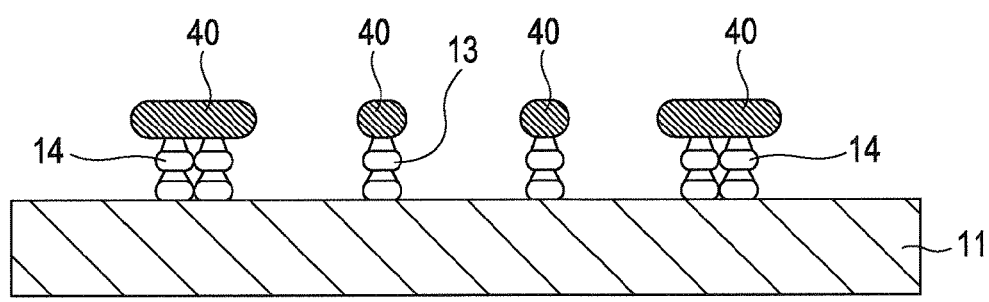

FIG. 6A shows the step of causing the adhesive agent 40 to adhere to the distal ends of the bumps 13 and 14 formed on the substrate 11. The adhesive agent 40 is thinly and flatly coated on a surface of a transfer table 42 formed on a planar surface, and the vertexes of the bumps 13 and 14 formed on the substrate 11 are brought into contact with the transfer table 42 such that the distal ends of the bumps 13 and 14 face downward. The thickness of the adhesive agent 40 on the transfer table 42 is set to a thickness (about 10 to 20 μm) enough to bury the vertexes of the bumps 13 and 14, so that the adhesive agent 40 can be caused to adhere to only the vertexes of the bumps 13 and 14. FIG. 6B shows a state in which the adhesive agent 40 adheres to the distal ends of the bumps 13 and 14.

Figure 6C:
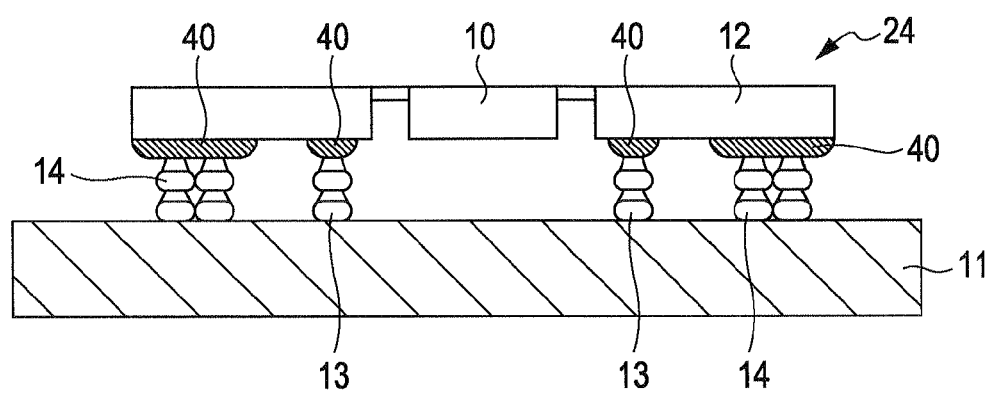

After the adhesive agent 40 is caused to adhere to the distal ends of the bumps 13 and 14, the MEMS chip 12 is joined to be aligned to the bumps 13 and 14. FIG. 6C shows a junction between the substrate 11 and the MEMS chip 12.

Since the adhesive agent 40 adheres only to the distal ends of the bumps 13 and 14, when the MEMS chip 12 is caused to adhere to the substrate 11, the adhesive agent 40 is joined to the MEMS chip 12 at the distal ends of the bumps 13 and 14. In an MEMS mounting structure, according to the embodiment, the adhesive agent 40 adheres to the MEMS chip 12 only at the distal ends of the bumps 13 and 14, and the adhesive agent 40 is not supplied to fill a portion between the substrate 11 and the MEMS chip 12. Therefore, even though the adhesive agent 40 contacts when the adhesive agent 40 is hardened, stress generated by contraction of the adhesive agent 40 does not strongly act on the MEMS chip 12. Therefore, an influence of stress generated when the MEMS chip 12 is joined to the substrate 11 on the micro mirror element 10 formed on the MEMS chip 12 can be suppressed, and the characteristics of the micro mirror element 10 can be prevented from being changed.

The bump 13 is a conducting bump, and is electrically connected to a wiring pattern formed on the substrate 11, a wiring pattern formed on the MEMS chip 12, and an electrode to tilt the micro mirror element 10. For this reason, a joining pad is formed at a position where the bump 13 is joined to a lower surface of the MEMS chip 12. On the other hand, the bump 14 is a reinforcing bump, and a wiring pattern connected to the bumps 14 is not formed on the MEMS chip 12. Therefore, a conductive adhesive agent is used as the adhesive agent 40 to make it possible to achieve an electric connection between the bump 13 and the MEMS chip 12 and a junction between the bump 14 and the MEMS chip 12.

As the adhesive agent 40, various conductive adhesive materials can be used. For example, when an anisotropic conductive adhesive agent is used as the adhesive agent 40, the electric connection between the bump 13 and the MEMS chip 12 and a preferable junction between the bumps 14 and the MEMS chip 12 can be achieved. Since the anisotropic conductive adhesive agent contains conductive particles, the bump 13 and the MEMS chip 12 can be electrically connected to each other, and the adhesive agent has adhesive force equal to that of a resin adhesive agent. For this reason, the MEMS chip 12 can be reliably joined to the substrate 11.

A solder past can be used as the adhesive agent 40. When the solder paste is used as the adhesive agent 40, advantageously, the conducting bump 13 and the MEMS chip 12 can be electrically connected to each other reliably. With respect to the reinforcing bump 14, a dummy pad to which the bump 14 is joined is formed on the MEMS chip 12, so that the bump 14 can be joined to the MEMS chip 12 with predetermined adhesive force.

Figure 7:
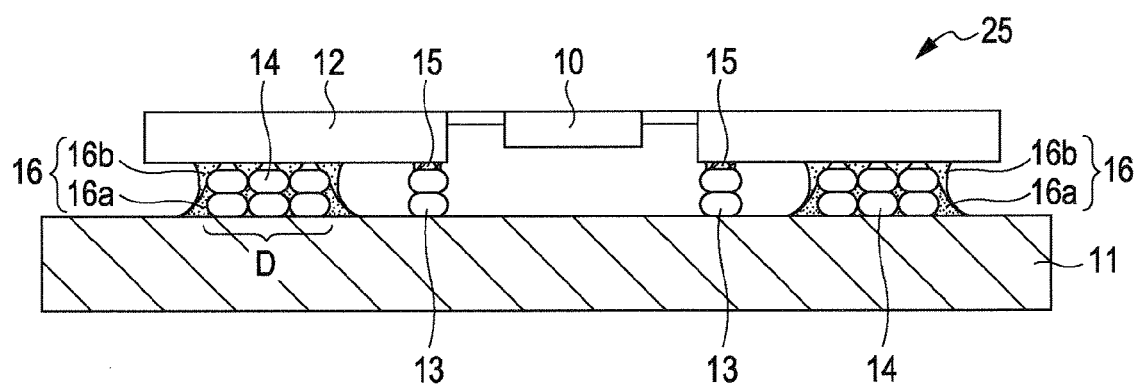
FIG. 7 is a sectional view of a fifth embodiment of an element mounting structure.

FIG. 7 shows a fifth embodiment of an element mounting structure. In an electronic part (MEMS) 25 of the embodiment, the adhesive agent 16 which bonds the substrate 11 and the MEMS chip 12 to each other includes a first adhesive agent 16a supplied to a lower side of the reinforcing bump 14 formed by stacking bumps in two layers and thermally hardened and a second adhesive agent 16b supplied onto the first adhesive agent 16a. The MEMS chip 12 is adhesively fixed to the bumps 14 by the second adhesive agent 16b.

In this manner, the adhesive agent 16 supplied to the bump 14 is supplied in two steps, so that in comparison with the case in which an adhesive agent is supplied to the entire area of the bump 14 to perform bonding, the adhesive agent thermally contracts in bonding to prevent the MEMS chip 12 from being deformed.

Figure 8A:
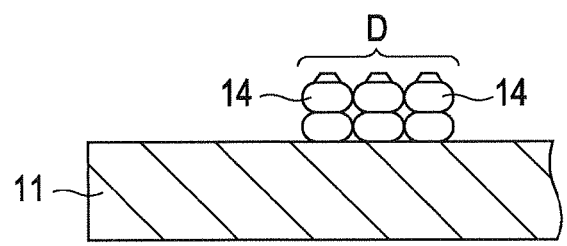
FIGS. 8A to 8E are diagrams for explaining manufacturing steps of the fifth embodiment.

FIGS. 8A to 8E show a method of manufacturing the electronic part 25. FIG. 8A shows a state in which the bump 14 is formed on the substrate 11. The bump 14 is formed by stacking bumps in two layers. However, the bump 14 can be obtained by stacking bumps in three or more layers. If the bump 14 can secure a height enough to support the MEMS chip 12, the bump 14 formed in one layer may be used. Nine bumps 14 are arranged in each of the adhesive regions D arranged on the substrate 11.

Figure 8B:
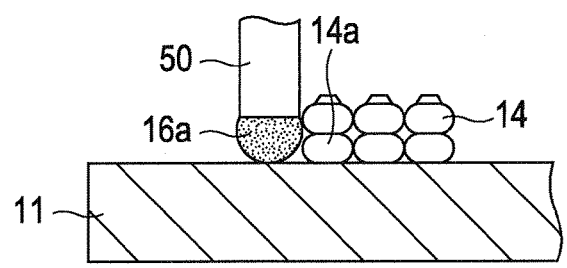

FIG. 8B shows the step of supplying the thermosetting first adhesive agent 16a to the bump 14 by using a dispenser needle 50. The first adhesive agent 16a is supplied to a lower side of the bumps 14. The dispenser needle 50 supplies the first adhesive agent 16a along a side surface of a bump 14a of the first layer.

The first adhesive agent 16a supplied to the bump 14 is thermally hardened by a heating process. Heating processes such as, a method of using an infrared heater, a method of heating the substrate 11 by a hot plate, or the like can be used.

Figure 8C:
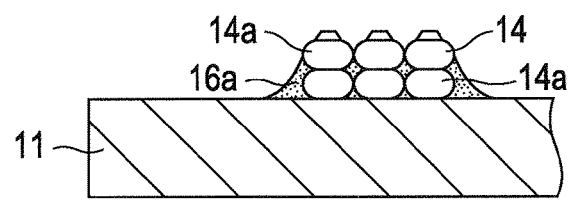

FIG. 8C shows a state in which the first adhesive agent 16a is thermally hardened. The first adhesive agent 16a adheres to a portion extending from the surface of the substrate 11 to the side surface of the first bump 14a in a meniscus shape and hardened. The bumps 14 are arranged such that outer surfaces thereof are adjacent to each other. Therefore, the first adhesive agent 16a is also filled in an intermediate portion between the adjacent bumps 14 and hardened.

It is an object of supplying the first adhesive agent 16a to the lower side of the bump 14 such that an interval portion between the bump 14 and the substrate 11 and an interval portion on the lower side between adjacent bumps are filled with the first adhesive agent 16a to reduce a supply amount of the second adhesive agent 16b. Therefore, an amount of adhesive agent supplied as the first adhesive agent 16a is not limited to a specific amount. However, the amount is preferably set to about ⅓ to ⅔ of a total amount of the adhesive agent 16 supplied to the bump 14. The supply amount of the second adhesive agent 16b is set to suppress thermal contraction caused when bonding is performed by the second adhesive agent 16b and to obtain a prescribed adhesive strength.

Figure 8D:
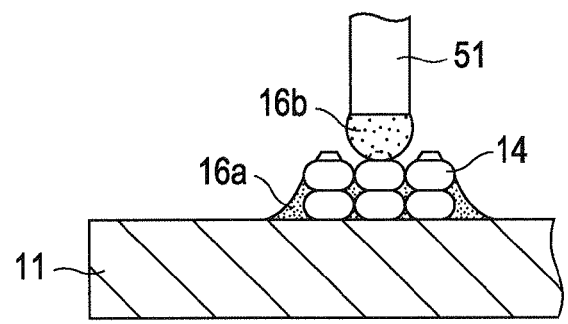

FIG. 8D shows the step of supplying the second adhesive agent 16b to the bump 14. The second adhesive agent 16b is applied to the bump 14 from above using a dispenser needle 51.

Figure 8E:
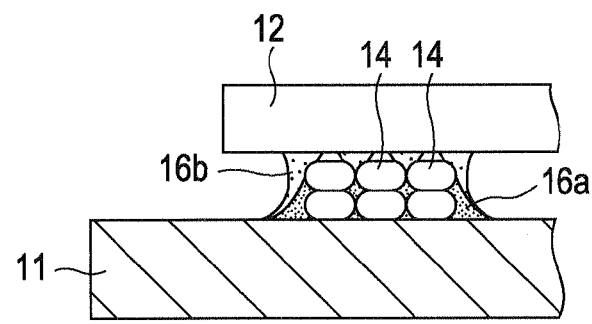

The MEMS chip 12 is then adhered to the bump 14 (FIG. 8E). When the MEMS chip 12 is adhered thereto, the second adhesive agent 16b is supplied to the bump 14, and the conductive paste 15 is supplied to the conducting bump 13. Thereafter, the MEMS chip 12 may be aligned to the substrate 11, pressed, and heated. Heating processes such as, a method of using an infrared heater, a method of heating the substrate 11 by a hot plate, or the like can be used.

The second adhesive agent 16b is thermally hardened, and the MEMS chip 12 is adhesively fixed to the bump 14. With respect to the conducting bump 13, the MEMS chip 12 and the bump 13 are joined to each other by the conductive paste 15.

In the method of manufacturing an electronic part (MEMS) according to the present embodiment, the lower side of the bump 14 is filled with the first adhesive agent 16a. For this reason, only the second adhesive agent 16b on the upper (upper-layer) side of the bump 14 contributes to adhesion of the MEMS chip 12. Since an amount of the second adhesive agent 16b supplied to the upper side of the bump 14 is smaller than an amount of adhesive agent supplied to an entire area of the bump 14 in an adhesive region, a thermal contraction rate obtained when the second adhesive agent 16b is thermally hardened is suppressed to be smaller than thermal contraction obtained when the second adhesive agent 16b is supplied to the entire area of the bump 14. More specifically, deformation acting on the MEMS chip 12 by thermal contraction of the adhesive agent can be suppressed.

As to the amount of the second adhesive agent 16b, the upper side of the bump 14 is filled with the second adhesive agent 16b, and the second adhesive agent 16b may be filled between the lower surface of the MEMS chip 12 and the outside surface of the bumps 14 in a meniscus shape. The MEMS chip 12 is brought into contact with an upper portion of the bump 14 to regulate a level position from the substrate 11. The second adhesive agent 16b is filled between the upper portion of the bump 14 and the MEMS chip 12 to obtain reliable adhesion force.

As to the first adhesive agent 16a and the second adhesive agent 16b, the same adhesive agent may be used, or different adhesive agents may be used. When the same adhesive agent is used, sufficient adhesive force (adhesion) between the first adhesive agent 16a and the second adhesive agent 16b is secured. When the different adhesive agents are used, adhesive agents which can secure sufficient adhesive force between the first and second adhesive agents 16a and 16b are selected to make it possible to reliably adhesively fix the MEMS chip 12 to the substrate 11. When the different adhesive agents are used, an adhesive agent having a thermal contraction in thermal hardening smaller than that of the first adhesive agent 16a is selected as the second adhesive agent 16b, so that deformation acting on the MEMS chip 12 can be suppressed.

In the embodiment, an adhesive agent is supplied to the bumps 14 in two steps. After the adhesive agent on the lower layer is thermally hardened, the adhesive agent for the upper layer is supplied. When the height of the bump 14 is further increased, the adhesive agent supplied to the bump 14 is divided in three steps, and the adhesive agents are sequentially supplied from the lower-layer side while being thermally hardened, so that the MEMS chip 12 can also adhere to the bump 14 by the adhesive agent of the uppermost layer.

Figure 9A:
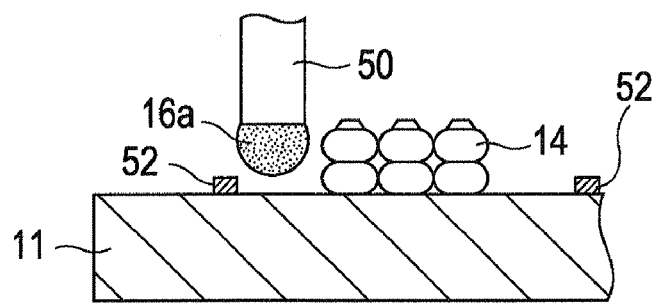
FIGS. 9A to 9C are sectional views showing a sixth embodiment of an element mounting structure and manufacturing steps thereof.
Figure 9B:
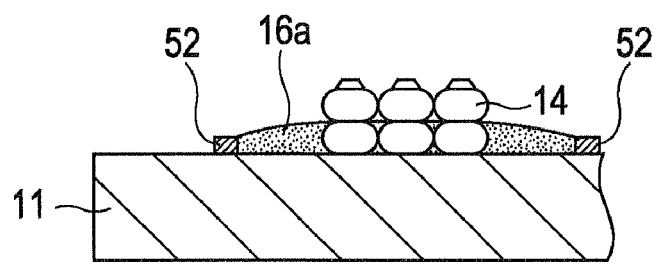
Figure 9C:
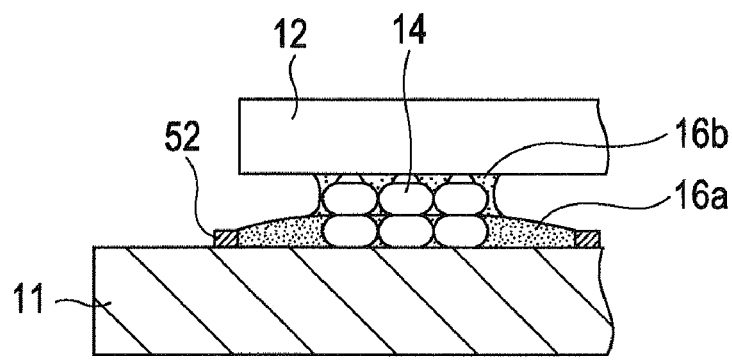

FIGS. 9A to 9C show a sixth embodiment of an element mounting structure and steps in manufacturing an electronic part.

In the embodiment depicted, a dam 52 which prevents the adhesive agent used to adhesively fix the substrate 11 and the MEMS chip 12 from spreading is formed around a portion on which the bumps 14 to support the MEMS chip 12 formed on the substrate 11 are formed.

FIG. 9A shows a state in which the dam 52 is formed on the substrate 11 and the first adhesive agent 16a is supplied by dispenser needle 50.

The dam 52 is formed to surround the circumference of the adhesive region on the substrate 11 on which the plurality of bumps 14 are adjacently arranged.

As for a method of forming the dam 52; a method of sticking a resin film formed in a ring shape to a surface of the substrate 11 or a method of applying a resin material in the form of the dam 52 to form the dam 52 can be used. Furthermore, a method of covering the surface of the substrate 11 with a photosensitive film and forming the photosensitive film in the form of the dam 52 as a pattern, a method of depositing and forming a metal layer on the substrate 11 and forming the metal layer in the form of the dam 52 as a pattern can also be used. When the dam 52 is formed by the metal layer, the dam 52 can also be formed by using the step of forming a wiring pattern on the substrate 11.

FIG. 9B shows a state in which the first adhesive agent 16a is supplied to the inside of the dam 52.

When the first adhesive agent 16a is supplied, the first adhesive agent 16a is blocked by the dam 52 such that the first adhesive agent 16a is prevented from spreading. For this reason, the first adhesive agent 16a is supplied such that the circumference of the bumps 14 is coated with the first adhesive agent 16a having a predetermined thickness.

After the first adhesive agent 16a is supplied, a heating process is performed to thermally harden the first adhesive agent 16a.

The second adhesive agent 16b is supplied to the upper side of the bump 14 to cover the upper side of the bump 14 with the second adhesive agent 16b, so that the MEMS chip 12 is bonded.

The second adhesive agent 16b fills the upper side of the bump 14 obtained by stacking bumps in two layers. The second adhesive agent 16b is filled between the upper surface of the first adhesive agent 16a and the lower surface of the MEMS chip 12 in a meniscus shape.

After the second adhesive agent 16b is supplied to the bump 14, the MEMS chip 12 is aligned to the substrate 11, the second adhesive agent 16b is thermally hardened by a heating process, and the substrate 11 and the MEMS chip 12 are adhesively fixed to each other (FIG. 9C).

In the embodiment, the dam 52 is formed on the circumference of bump junction portions, and the first adhesive agent 16a is supplied to the inside of the dam 52. For this reason, even though the first adhesive agent 16a has high fluidity, the adhesive agent can be prevented from spreading in a wide area. In this manner, the first adhesive agent 16a can be supplied to the bump junction portions to have a predetermined thickness.

Even in the embodiment, the first adhesive agent 16a is supplied to the lower-layer side of the bump 14 to make it possible to suppress the amount of the second adhesive agent 16b which contributes to bonding of the MEMS chip 12. The amount of the second adhesive agent 16b is comparatively reduced to make it possible to suppress deformation to the MEMS chip 12 by thermal contraction of the adhesive agent when the MEMS chip 12 is bonded to the substrate 11.

As for the configuration of the dam 52, the dam 52 may continuously surround the bump junction portions in a circumferential direction, or the dam 52 may be partially cut away. When the fluidity of the adhesive agent is low, the dam 52 may be arranged to interrupt the adhesive agent only in a direction in which spreading of the adhesive agent is desired to be suppressed.

FIGS. 10A to 10E show another embodiment in which an adhesive agent is supplied to the reinforcing bump 14 arranged in an adhesive region of the substrate 11.

In the embodiment, an electronic part is manufactured by using a method of covering the bump 14 which supports the MEMS chip 12 formed on the substrate 11 with a cap jig 53 to supply the first adhesive agent 16a.

Figure 10A:
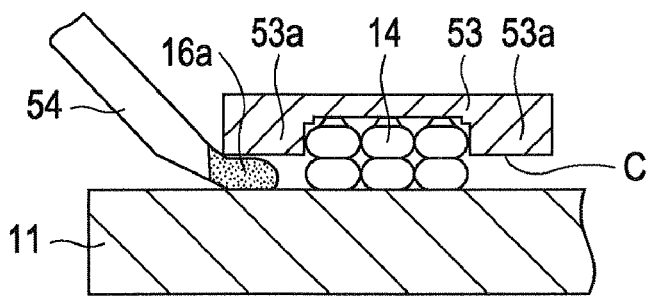
FIGS. 10A to 10E are sectional views showing a seventh embodiment of an element mounting structure and manufacturing steps thereof.

FIG. 10A shows a state in which the bump 14 is covered with the cap jig 53 and the first adhesive agent 16a is supplied by using a dispenser needle 54.

The cap jig 53 has a recessed portion which stores a top side of the bump 14 to cover the upper portion of the bumps 14 formed in the adhesive region on the substrate 11. An outer edge 53a of the cap jig 53 is formed such that a lower surface C of the cap jig 53 is spaced apart from the surface of the substrate 11 by a length corresponding to the height of one bump when the bump 14 is covered with the cap jig 53.

The first adhesive agent 16a is supplied to an interval portion between the lower surface C of the outer edge 53a and the surface of the substrate 11 by the dispenser needle 54.

Figure 10B:
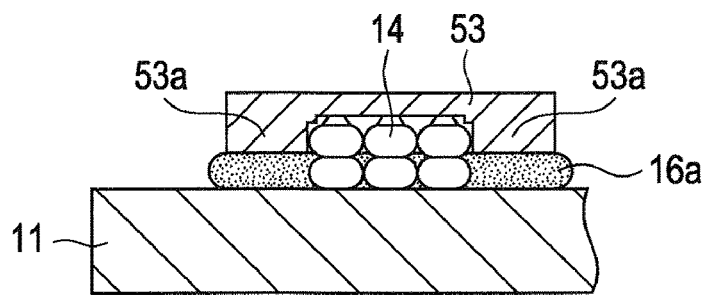

FIG. 10B shows a state in which the first adhesive agent 16a is supplied to a portion between the substrate 11 and the lower surface of the outer edge 53a of the cap jig 53. The first adhesive agent 16a fills the interval portion between the substrate 11 and the outer edge 53a of the cap jig 53 by capillarity. In this state, the first adhesive agent 16a is thermally hardened. In this manner, the first adhesive agent 16a covers the surface of the substrate 11 to have a predetermined thickness.

Figure 10C:
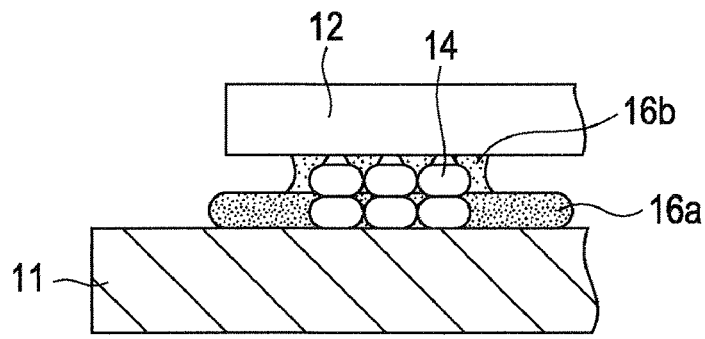

FIG. 10C shows a state in which, after the cap jig 53 is removed, the second adhesive agent 16b is supplied to the bump 14, and the MEMS chip 12 is adhesively fixed by the second adhesive agent 16b.

Figure 10D:
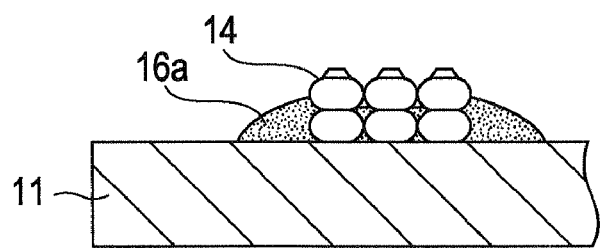
Figure 10E:
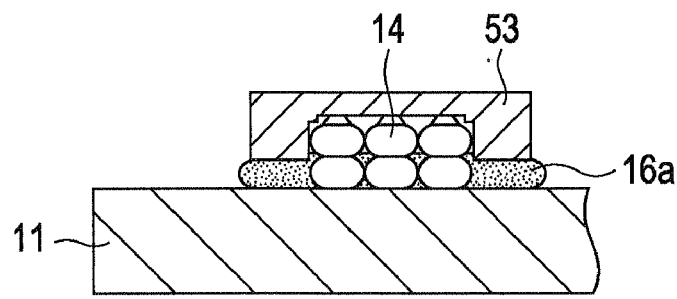

FIGS. 10D and 10E show manufacturing steps in a method of supplying the first adhesive agent 16a to the bump 14 in advance, covers the upper portion of the bumps 14 with the cap jig 53, and planarly spreading the first adhesive agent 16a on the substrate 11.

The first adhesive agent 16a is supplied to the bump 14 (FIG. 10D), the cap jig 53 is covered on the bump 14, so that the first adhesive agent 16a planarly spreads. In the state in which the cap jig 53 is attached to the bump 14, the first adhesive agent 16a is thermally hardened, and the bump 14 and the periphery of the bump 14 are covered such that the first adhesive agent 16a spreads to have a predetermined thickness. Then, the cap jig 53 is removed, the second adhesive agent 16b is supplied, and the MEMS chip 12 is bonded by the second adhesive agent 16b.

Even in the embodiment, when the second adhesive agent 16b is supplied to the upper side of the bump 14 to which the first adhesive agent 16a has been supplied, an amount of the second adhesive agent 16b which contributes to bonding of the MEMS chip 12 can be made less than an amount of adhesive agent supplied to the entire area of the bumps 14. In this manner, when the MEMS chip 12 is bonded, deformation caused by thermal contraction of the adhesive agent can be suppressed.

When a depth of the recessed portion of the cap jig 53 is changed, or when a planar shape of the outer edge 53a of the cap jig 53 is changed, a spreading shape or a thickness of the first adhesive agent 16a can be changed.

FIGS. 11A to 11D show an eighth embodiment of an element mounting structure and steps in manufacturing an electronic part.

In the embodiment depicted, a dummy bump 55 is formed in addition to the bump 14 which supports the MEMS chip 12.

Figure 11A:
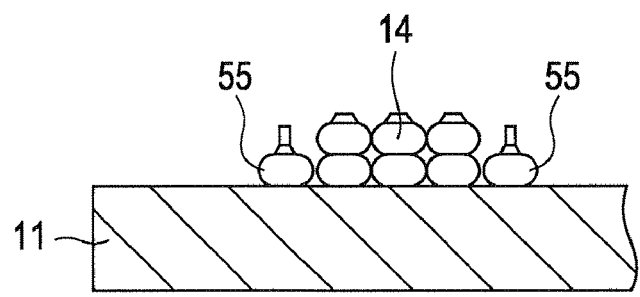
FIGS. 11A to 11D are sectional views showing an eighth embodiment of an element mounting structure and manufacturing steps thereof.

FIG. 11A shows a state in which the bump 14 and the dummy bump 55 are formed on the substrate 11. The bump 14 is formed by stacking bumps in two layers. In contrast to this, the dummy bump 55 is formed in one layer. The dummy bumps 55 are arranged around a portion on which the bumps 14 are formed to be adjacent to the bumps 14. The dummy bump 55 is formed in the form of a bump by ball bonding. On the dummy bump 55 shown in FIG. 11A, an uncut wiring material projects from the top. The dummy bump 55 may be formed such that a cut end of the wiring material projects from the bump.

Figure 11B:
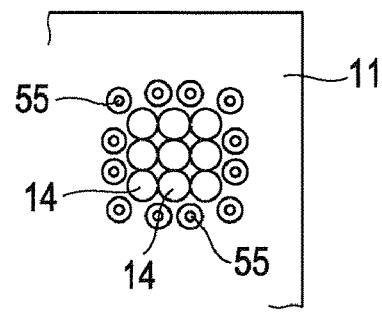

FIG. 11B shows a state in which the dummy bumps 55 are formed around the bumps 14 in the adhesive region in a planar view. In FIG. 11B, nine bumps 14 are formed in the adhesive region. The dummy bumps 55 are arranged to surround a region in which the bumps 14 are formed. The number of arranged bumps 14 and arrangement positions thereof fluctuate. Therefore, the dummy bump 55 may be arbitrarily arranged in accordance with planar arrangements of the bumps 14 in the adhesive region.

Figure 11C:
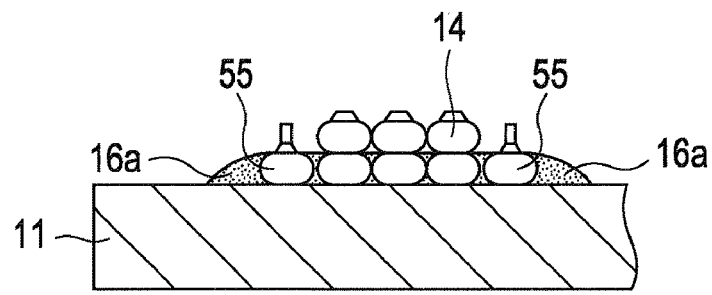

FIG. 11C shows a state in which the first adhesive agent 16a is supplied to the adhesive region. The first adhesive agent 16a is brought into contact with the dummy bump 55. Since the dummy bumps 55 are arranged around the bumps 14, the first adhesive agent 16a enters a portion between the dummy bump 55 and the substrate 11, a portion between the dummy bump 55 and the bump 14, and a portion between the bumps 14.

The dummy bump 55 functions like a dam to store the first adhesive agent 16a in a region of the bump junction portion, and functions to store a predetermined amount of the first adhesive agent 16a in the bump junction portion.

After the first adhesive agent 16a is thermally hardened by a heating process, the second adhesive agent 16b is supplied to the upper side of the bump 14, and the MEMS chip 12 is bonded to the bump 14 by the second adhesive agent 16b.

Figure 11D:
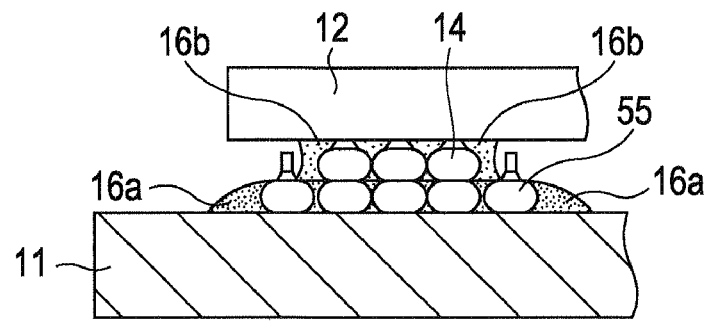

FIG. 11D shows a state in which the MEMS chip 12 is adhesively fixed to the substrate 11. The dummy bumps 55 are formed around the bumps 14 to prevent the second adhesive agent 16b from leaking from the region in which the bumps 14 are arranged. The second adhesive agent 16b preferably fills a portion between the second adhesive agent 16b and the MEMS chip 12, so that the MEMS chip 12 can be reliably bonded to the bump 14.

Even in the embodiment, thermal contraction caused when the MEMS chip 12 is bonded by the second adhesive agent 16b is suppressed to be smaller than thermal contraction obtained in a conventional method, and the MEMS chip 12 can be prevented from being substantially deformed.

In the method using the dummy bump 55 according to the embodiment, the dummy bump 55 can be formed by using the step of forming the bump 14 by ball bonding, and it is advantageous that the conventional steps in manufacturing an electronic part need not be largely changed.

FIGS. 12A to 12D show a ninth embodiment of an element mounting structure and steps in manufacturing an electronic part.

In the embodiment, a step portion 56 is formed around a bump junction portion on which the bumps 14 for supporting the MEMS chip 12 are formed.

Figure 12A:
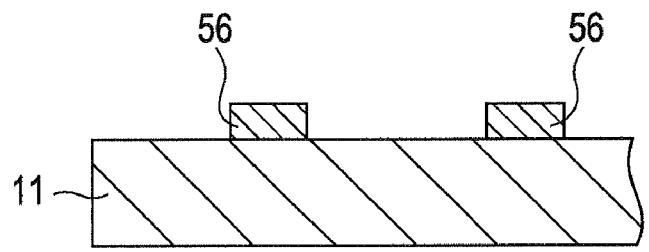
FIGS. 12A to 12D are sectional views showing a ninth embodiment of an element mounting structure and manufacturing steps thereof.

FIG. 12A shows a state in which the step portion 56 is formed on the substrate 11. The step portion 56 is formed to have a height almost equal to the height of one layer of the bump 14. In this embodiment, a photosensitive resist material is deposited on the substrate 11 to have a thickness equal to that of the step portion 56, the resist material is exposed, developed, and patterned to leave the step portion 56, so that the step portion 56 is formed.

Figure 12B:
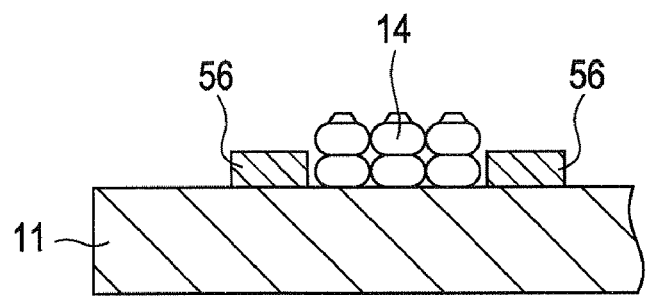

FIG. 12B shows a state in which the bump 14 is formed in an internal region of the step portion 56. The bump 14 is formed by ball bonding to make an outer surface of the bump to be close to the inner surface of the step portion 56.

Figure 12C:
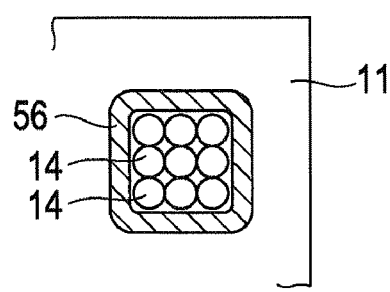

FIG. 12C shows a state in which the bump 14 is formed in a planar view. The bump 14 is arranged inside a region surrounded by the step portion 56.

The step portion 56 is formed, and the bump 14 is formed. Thereafter, the adhesive agent 16 is supplied to an upper side of the bump 14, and the MEMS chip 12 is bonded to the bump 14 by using the adhesive agent 16.

Figure 12D:
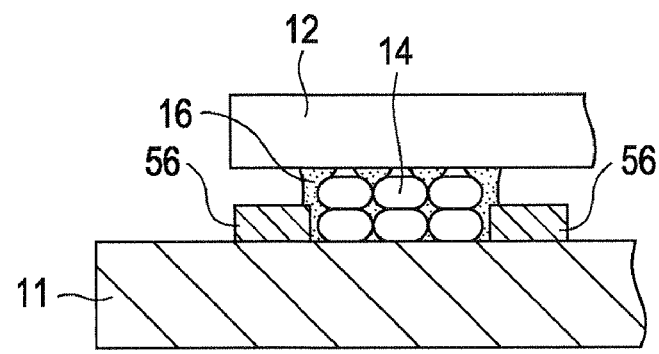

FIG. 12D shows a state in which the MEMS chip 12 is bonded to the substrate 11 by the adhesive agent 16. In the conventional method, the adhesive agent 16 is supplied to fill a portion between the substrate 11 and the MEMS chip 12. In contrast to this, in the embodiment depicted, the adhesive agent 16 is mainly supplied to a bump portion of the upper layer, and the adhesive agent 16 is supplied only to a portion between the bumps 14 at a bump portion of the lower layer. In this manner, an amount of adhesive agent can be made smaller than that in the conventional method, and deformation of the adhesive agent by thermal contraction can be suppressed from acting on the MEMS chip 12.

According to the element mounting structures according to all the above embodiments, stress generated when an element having a movable portion is mounted on a substrate can be suppressed from acting on the movable portion. The element can be prevented from being deformed, quality of the element can be suppressed from fluctuating, and a reliable electronic part can be provided. Furthermore, a yield of products can be increased.

The MEMS mounting structure has been explained as the embodiments. However, there are MEMS products of a very large number of types. The embodiments can also be applied to the MEMS product other than the micro mirror element 10. The embodiments can also be applied to an MEMS product which does not have a movable portion. The embodiments can be applied to a product having a configuration in which a void portion is formed between an element and a substrate to mount the element spaced apart from the substrate.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An electronic part comprising:
a substrate having a first planar surface;
a MEMS chip including a micro mirror element;
a conductive bump electrically connecting the substrate and the MEMS chip, the conductive bump coupled to the MEMS chip via a conductive paste;
a first dummy bump affixed to the first planar surface of the substrate and the MEMS chip;
a second dummy bump affixed to the first planar surface of the substrate a predetermined distance from the first dummy bump; and
an adhesive region bonding with the substrate and the MEMS chip, the adhesive region encompassing the first dummy bump except for the second dummy bump,
wherein the conductive bump is different than the first and second dummy bumps, and wherein the adhesive region is not conductive.

2. An electronic part comprising:
a substrate having a first planar surface;
a MEMS chip including a micro mirror element;
a conductive bump electrically connecting the substrate and the MEMS chip, the conductive bump coupled to the MEMS chip via a conductive paste;
a dummy bump directly affixed to the first planar surface of the substrate and the MEMS chip;
an adhesive region bonding with the substrate and the MEMS chip, the adhesive region embedding the first dummy bump therein, wherein the conductive bump is different than the dummy bump, and wherein the adhesive region is not conductive; and
a slit disposed on the MEMS chip, the slit located between the conductive bump and the dummy bump.

3. An electronic part comprising:
a substrate having a first planar surface;
a MEMS chip including a micro mirror element;
a conductive bump electrically connecting the substrate and the MEMS chip, the conductive bump coupled to the MEMS chip via a conductive paste;
a dummy bump directly affixed to the first planar surface of the substrate and the MEMS chip; and
an adhesive region bonding with the substrate and the MEMS chip, the adhesive region embedding the dummy bump therein, wherein the conductive bump is a different height than the dummy bump, and wherein the dummy bump space away from the MEMS chip,
wherein a thickness of the MEMS chip is greater than a thickness of the substrate.

* * * * *